United States Patent [19]
Wilcox

[11] 3,727,096
[45] Apr. 10, 1973

[54] DEFLECTION DRIVER CONTROL CIRCUIT FOR A TELEVISION RECEIVER

[75] Inventor: Milton E. Wilcox, Mesa, Ariz.

[73] Assignee: Motorola, Inc., Franklin Park, Ill.

[22] Filed: Feb. 3, 1971

[21] Appl. No.: 112,280

[52] U.S. Cl. ....................315/27 TD
[51] Int. Cl. ....................H01j 29/70
[58] Field of Search ....................315/27 R, 27 TD, 315/28

[56] References Cited

UNITED STATES PATENTS 3,602,768 8/1971 Williams, Jr. ....................315/27 TD

*Primary Examiner*—Carl D. Quarforth
*Assistant Examiner*—J. M. Potenza
*Attorney*—Mueller & Aichele

[57] ABSTRACT

A monolithic integrated vertical deflection coil driver circuit for a television receiver is disclosed. To permit driving of a vertical deflection coil directly from output transistors located on the monolithic integrated circuit chip, a flyback control circuit using an energy storage capacitor is employed to obtain a voltage pulse in excess of the voltage of the power supply and having sufficient energy to provide proper vertical deflection flyback. The voltage necessary to initiate flyback is low enough to be compatible with monolithic integrated circuit technology.

8 Claims, 1 Drawing Figure

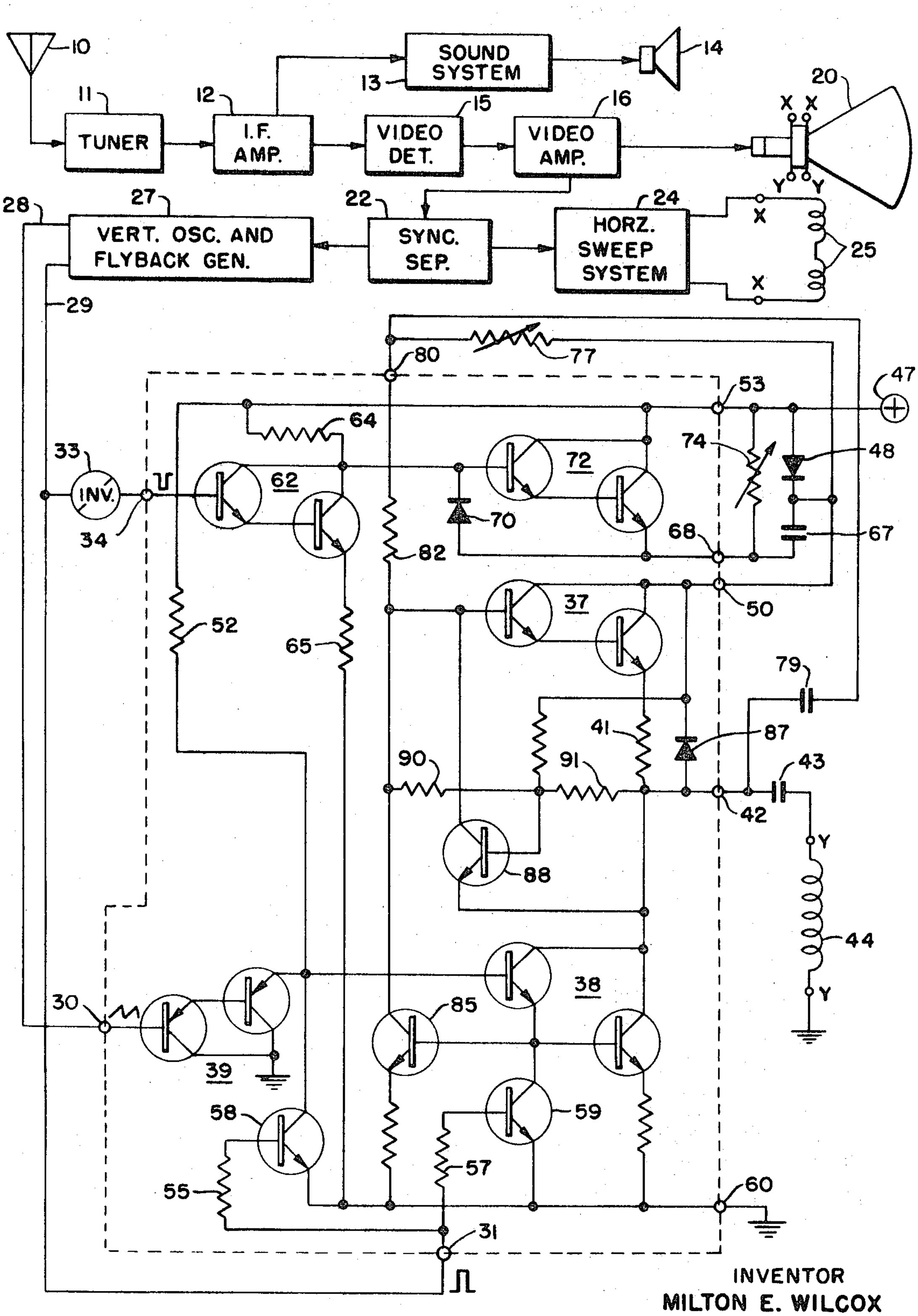
INVENTOR
MILTON E. WILCOX
BY Mueller & Aichele
ATTORNEYS

DEFLECTION DRIVER CONTROL CIRCUIT FOR A TELEVISION RECEIVER

BACKGROUND OF THE INVENTION

A large number of the different circuits employed in television receivers, both black and white and color, have been provided in integrated circuit form because of the inherent advantages of such integrated circuits. In some portions of television receivers, however, it has been difficult to devise integrated circuits which can be substituted for discrete circuits. This has been true of the vertical deflection portion of the receiver, primarily because the output or driver circuit coupled to the vertical deflection coil ordinarily must be capable of withstanding high voltage transients (commonly of the order of 200 volts or so) during the retrace of flyback portion of the cycle of operation of the circuit. This high voltage transient is produced by allowing the vertical deflection coil to ring back through the circuit during the flyback portion of the cycle. While a ringing voltage of this magnitude does not affect vertical driver circuits employing tubes or discrete power transistors as the output driver amplifiers, integrated circuits manufactured by presently known techniques cannot handle voltages of this magnitude without the possibility of damage to the transistors across which such voltages must appear.

SUMMARY OF THE INVENTION

Accordingly, it is an object of this invention to provide an improved deflection driver circuit.

It is an additional object of this invention to provide a deflection control circuit for use in a television receiver.

It is a further object of this invention to provide a deflection control circuit permitting the driving of a deflection coil of a television receiver directly from an integrated circuit chip.

It is yet another object of this invention to provide a deflection control circuit permitting the operation of a deflection coil driving circuit without subjecting the driving circuit to high voltage transient pulses during the flyback portion of the operating cycle.

In accordance with a preferred embodiment of this invention, a deflection control circuit includes a charge storage capacitor connected in a series circuit between a pair of voltage supply terminals. The charge on the capacitor builds up during the trace interval of operation of the deflection driver circuit through a charging path completed through first and second switches to cause the capacitor to store a charge which is substantially equal to the magnitude of the supply voltage. A third normally open switch is coupled between the first supply terminal and the junction of the capacitor with the first switch; and during the flyback interval of operation of the deflection circuit, the first switch is opened and the third switch is closed to reverse the connections of the capacitor with the first supply terminal. This causes the potential on the side of the capacitor connected with the second switch to rise to a value which is approximately double of that supply voltage, and this potential is connected to the driver circuit to constitute the power supply applied to the driver circuit during the retrace interval to effect rapid reversal of the current in the deflection coil.

BRIEF DESCRIPTION OF THE DRAWING

The sole FIGURE of the drawing is a circuit diagram, partially in block form, of a preferred embodiment of the invention.

DETAILED DESCRIPTION

Referring now to the drawing, there is shown a television receiver including an antenna 10, which applies a received composite television signal to a tuner and RF amplifier stage 11. The output of the tuner stage 11 then is applied to an IF amplifier, which provides an output to a sound system 13 to drive a loudspeaker 14 and which also provides an output to a video detector circuit 15 connected to a video amplifier circuit 16. The video amplifier circuit 16 may include the necessary video stages for a black and white receiver or the luminance and chrominance amplifier stages for a color television receiver. The output of the video amplifier 16 then provides the input signals to a cathode ray tube 20, which produces an image on the screen thereof in accordance with the signals obtained from the output of the video amplifier stage 16. Since the details of the portion of the television receiver which have been described are unimportant to an understanding of the vertical deflection driver circuit, the details of this portion have not been shown in the drawing.

A sync separator circuit 22, which also may be of conventional type, also is responsive to signals obtained from the video amplifier 16 and provides the horizontal and vertical synchronizing pulses derived from the received composite television signal. The horizontal synchronizing pulses are applied to a horizontal sweep system 24, which provides an output to drive the horizontal deflection coils 25, located on the deflection yoke of the cathode ray tube 20 between the points X—X indicated in the drawing. Similarly, vertical synchronizing pulses are obtained from the sync separator circuit 22 and are applied to a vertical oscillator and flyback generator circuit 27, which produces a vertical sawtooth drive waveform on an output lead 28, and which also provides flyback pulses on a lead 29, with the flyback pulses being interlaced with the retrace intervals of the sawtooth waveform produced on the lead 28.

The lead 28 is connected to an input bonding pad 30 of an integrated vertical deflection driver circuit, which is indicated as enclosed in dotted lines in the drawing. Those components which are not formed as part of the integrated circuit, which preferably is of monolithic integrated form, are indicated on the drawing as located outside the dotted lines. Positive flyback pulses appearing on the lead 29 at the output of the oscillator and flyback generator circuit 27 are applied directly to a flyback input bonding pad 31 and are applied through an invertor 33 to a second flyback input bonding pad 34. During the trace interval of the sawtooth waveform produced by the oscillator and flyback generator circuit 27, the potential appearing on the bonding pad 34 is relatively high or positive, whereas the potential appearing on the bonding pad 31 is relatively low or near ground potential.

The output driving stage for the vertical deflection yoke basically comprises a pair of NPN Darlington amplifier stages 37 and 38. The input to the base of the input transistor of the Darlington stage 38 is obtained from the emitter of an input substrate PNP Darlington amplifier 39, the input transistor of which has its base connected to the bonding pad 30 for receipt of the sawtooth signal input. The emitter of the output transistor of the Darlington amplifier 37 is coupled through a resistor 41 to an output bonding pad 42, which is connected to the upper end of a coupling capacitor 43 connected in series with the vertical deflection coil 44, the other end of which is connected to ground. The output bonding pad 42 also is connected to the collector of the output transistor of the Darlington amplifier 38.

Operating potential for the output stage including the Darlington amplifiers 37 and 38 is obtained from a DC supply terminal 47, which is connected to a suitable source of positive DC potential (not shown). This potential is applied to the collector of the output transistor of the Darlington amplifier 37 through a coupling diode 48 connected between the terminal 47 and a DC supply bonding pad 50. Similarly, operating potential for the Darlington stage 39 is obtained from the terminal 47 by means of a connection through an emitter load resistor 52 to a bonding pad 53, which also is connected to the positive supply terminal 47.

During the scan or trace portion of the cycle of operation of the circuit, the potential on the lead 29 is relatively low or near ground and is applied to the bonding pad 31 and through a pair of coupling resistors 55 and 57 to the bases of a pair of NPN control transistors 58 and 59, causing these transistors to be rendered nonconductive since their emitters are connected directly to a grounded bonding pad 60. At the same time, the potential on the lead 29 is inverted by the invertor circuit 33 to cause a relatively positive potential to be applied to the bonding pad 34. This bonding pad is connected to the base of the input transistor of an NPN Darlington amplifier 62, causing the Darlington amplifier 62 to be rendered conductive to conduct current from the bonding pad 53 through a collector load resistor 64 and an emitter resistor 65 to the grounded bonding pad 60. In addition, this completes a charging path for a voltage boost capacitor 67, the charging extending from the supply terminal 47 through the diode 48, the capacitor 67, a bonding pad 68, a second diode 70, the collector-emitter path of the output transistor of the Darlington amplifier 62, and the resistor 65 to ground.

A flyback control switch in the form of a NPN Darlington amplifier 72 is connected between the positive potential supply bonding pad 53 and the junction of the capacitor 67 with the anode of the diode 70. The base of the input transistor of the Darlington amplifier 72 is coupled to the junction of the cathode of the diode 70 with the collector of the output transistor of the Darlington amplifier 62, so that the Darlington amplifier 73 is rendered nonconductive during the scan or trace portion of the cycle of operation of the circuit to operate as an open switch.

The charging rate for the capacitor 67, and therefore the ultimate charge attained by the capacitor 67 during each trace portion of a cycle of operation of the vertical oscillator and flyback generator 27, is controlled by means of a variable resistor 74 connected in shunt across the diode 48 and the capacitor 67. If the resistance of the resistor 74 is very high, approaching that of an open circuit, the fastest rate of charge for the capacitor 67 takes place since a maximum current is supplied from the terminal 47 through the charging path for the capacitor 67. As the resistance of the variable resistor 74 is decreased, the current diverted therethrough causes a reduction in the current flowing through the capacitor 67 and thereby causes a reduction in the charging rate of the capacitor.

When the scan or trace portion of the cycle of operation of the circuit is initiated, the magnitude of the sawtooth signal applied to the base of the input transistor of the PNP Darlington amplifier 39 is at its lowest level on the rising portion of the sawtooth waveform. This causes the PNP Darlington amplifier 39 to have its maximum conductivity, so that near ground potential appears on the emitter of the output transistor thereof. This near ground potential applied to the base of the input transistor of the Darlington amplifier 38 renders the Darlington amplifier 38 nonconductive.

At the same time, the upper output Darlington amplifier 37 is provided with an initial DC bias level obtained from a capacitor 79, the upper end of which is connected in series with a variable resistor 77 to the cathode of the diode 48, and the lower end of which is connected to the output bonding pad 42. The charge on the capacitor 79, and hence the DC bias level applied to the upper output Darlington amplifier 37 is regulated by the adjustment of the variable resistor 77. The charge on the capacitor 79 is coupled to a bonding pad 80 which in turn is connected through a resistor 82 to the base of the input transistor of the Darlington amplifier 37. This potential is sufficient to bias the Darlington amplifier 37 to a state of maximum conduction, so that current is supplied from the terminal 47, through the diode 48, the output transistor of the Darlington amplifier 37, and the resistor 41 to the output bonding pad 42. From the bonding pad 42 this current flows through the capacitor 43 and the vertical deflection coil 44 to ground and constitutes the maximum current supplied into the deflection coil to cause the necessary deflection for deflecting the beam in the cathode ray tube 20 to the top of the display screen.

As the sawtooth waveform ramp increases in magnitude, however, an increasing positive potential is applied to the base of the input transistor of the PNP Darlington amplifier 39, causing the conduction of the Darlington amplifier 39 to gradually decrease from a maximum amount, which causes the Darlington amplifier 38 to be nonconductive, toward a minimum amount which causes the Darlington amplifier 38 to become increasingly conductive. As stated previously, at the beginning of the scan or trace interval, the top Darlington amplifier 37 delivers all of the current into the bonding pad 42 through the deflection coil 44. As the bottom Darlington amplifier 38 is rendered increasingly conductive, it diverts an increasing amount of this current from the bonding pad 42 through the output transistor of the Darlington amplifier 38 to cause the current supplied to the deflection coil 44 continuously to decrease from the initial maximum amount. Increased conduction of the input transistor in the Darlington amplifier 38 also increases the forward drive at the base of an NPN control transistor 85 connected to the emitter of the input transistor of the Darlington amplifier 38. As the transistor 85 increases conduction, the current drawn by the collector thereof and connected to the base of the input transistor of the Darlington amplifier 37 diverts base current from the input transistor of the Darlington amplifier 37, which results in a reduction in the conductivity of the amplifier 37.

When the Darlington amplifier 38 is drawing the same amount of current that is supplied by the Darlington amplifier 37, all of the current supplied by the Darlington amplifier 37 flows through the Darlington amplifier 38; and no current is left to go through the coil 44. This corresponds to a coil current of zero at the center of the picture displayed on the screen of the cathode ray tube 20. As the conductivity of the lower Darlington amplifier 38 continues to increase, the conduction of the upper Darlington amplifier 37 continues to decrease and current flows out of the coil 44 into the bonding pad 42 and through the Darlington amplifier 38 to cause the vertical deflection of the beam in the cathode ray tube to increase toward the bottom of the screen.

At the end of scan, the bottom Darlington amplifier 38 is taking all of the current out of the coil; and the control transistor 85 draws sufficient current to starve the base current of the input transistor of the Darlington amplifier 37 to the point that the Darlington amplifier 37 is biased to nonconduction. Thus, during the scan intervals, the conduction of the Darlington amplifier 37 decreases from a maximum amount to the point where it is rendered nonconductive, while at the same time conduction of the Darlington amplifier 38 increases from a point where it is nonconductive to a point where it is conductive at a maximum level. When this latter state of operating conditions has been reached, the circuit is ready for the flyback interval.

The circuit shown in the drawing achieves flyback in the required time by turning off the scan circuit, the operation of which has just been described, and by applying a flyback voltage source to the vertical deflection coil 44 on command from the flyback pulse generated in the vertical oscillator and flyback generator circuit 27 and applied over the lead 29 to the bonding pads 31 and 34. The leading edge of this flyback pulse coincides with the end of the scan or trace portion of the sawtooth trace, while the width of the flyback pulse sets the flyback time and corresponds to the retrace portion of the sawtooth waveform applied to the bonding pad 30.

When the positive-going flyback pulses is applied to the bonding pad 31, both of the control transistors 58 and 59 are rendered conductive, causing near ground potential to appear on their collectors. Since the collectors of the transistor 58 is connected to the base of the input transistor for the Darlington amplifier 38, the Darlington amplifier 38 is rendered nonconductive. At the same time, the near ground potential appearing on the collector of the transistor 59 biases the control transistor 85 into a state of nonconduction, causing the maximum forward biasing potential once again to be reestablished on the base of the input transistor of the Darlington amplifier 37. Simultaneously, the negative-going flyback pulse appearing on the bonding pad 34 renders the Darlington amplifier 62 nonconductive. This drives the Darlington amplifier 72 into full conduction as a result of the substantial rise in potential on the collector of the output transistor of the Darlington amplifier 62.

The sudden interruption of conduction of the output transistor of the Darlington amplifier 38 when it was removing the peak current from the deflection coil 44 causes the voltage across the coil 44 to rise rapidly. Current continues to flow out of the coil 44 through the capacitor 43 and a now forward-biased damping diode 87, the capacitor 67, the diode 70, and the now-forward biased base-collector junction of the input transistor of the Darlington amplifier 72 to the positive supply 47. Due to the high potential appearing across the deflection coil 44, the diode 48 is reverse-biased. At the same time that this occurs, the output transistor of the Darlington pair 72 connects the bonding pad 53 to the lower side of the capacitor 67. Thus, the potential appearing at the junction of the upper side of the capacitor 67 rises to near twice the potential applied to the terminal 47. At the initial portion of the retrace interval, however, the voltage across the deflection coil 44 exceeds even this double potential; so that the deflection coil 44 initially supplies current through the path just mentioned to dissipate energy into the positive supply connected to the terminal 47.

When the potential across the coil 44 equals the potential at the junction of the diode 48 and the capacitor 67 (now double the supply potential), the coil current has gone to zero and the diode 87 ceases conduction. At this point, the output transistor of the Darlington amplifier 37 begins conducting in the forward direction, once again biased by the potential applied from the charge on the capacitor 79 through the coupling resistor 82 to the base of the input transistor thereof. Since the Darlington amplifier stage 38 is rendered nonconductive at this time, the output transistor of the Darlington amplifier 37 delivers peak current to the deflection coil 44 and is saturated as the current rises in the coil 44.

The potential at the start of this portion of the flyback cycle is obtained from the capacitor 67 and is near double the potential available from the supply at the terminal 47. The terminal 47 is isolated from the capacitor 67 by the reverse-biased diode 48 which operates as a now-open switch. Thus, the capacitor 67 acts as a voltage boost to provide a rapid increase in the current supplied to the coil 44 for the retrace interval. When the charge on the capacitor 67 drops below the value of the supply potential, the diode 48 becomes conductive to supply current to the amplifier 37. The parameters of the circuit are selected so that the current flowing through the output transistor of the Darlington amplifier 37 has just risen to the maximum current in the forward direction when the flyback control pulse terminates.

Upon termination of the flyback control pulse on the lead 29, the Darlington amplifier 62 is rendered conductive and the Darlington amplifier 72 is rendered nonconductive as are the control transistors 58 and 59. The circuit then resumes the next cycle of operation for the scan interval, repeating the sequence which has been described.

Two types of short circuit protection are desirable for the integrated circuit which is illustrated in the drawing, these being a short to supply and a short to ground. In the circuit shown, the output bonding pad 42 may be shorted to the B+ supply safely because the current in the lower Darlington amplifier 38 is clearly defined by the input voltage applied to the bonding pad 30. If the output bonding pad 42, however, is shorted to ground, the current through the upper Darlington amplifier 37 could increase to the point where destruction of the transistors would result. To prevent this from happening, a short circuit NPN protection transistor 88 is provided, with the collector-emitter path thereof connected between the base of the input transistor of the Darlington stage 37 and the output bonding pad 42. A voltage divider, including a pair of resistors 90 and 91, is connected in series across these same points, and the base of the transistor 88 is coupled to the junction of the resistors 90 and 91.

If the bonding pad 42 is connected to ground, current flows through the resistors 82, 90 and 91 to the grounded bonding pad 42. This causes a forward biasing potential drop to occur across the resistor 91, so that the transistor 88 (which is normally nonconductive) conducts to apply a near ground potential to the base of the input transistor of the Darlington amplifier 37, rendering the Darlington amplifier 37 nonconductive. Therefore, current ceases to be drawn by the Darlington amplifier 37 and overload protection for the grounded output bonding pad 42 has been effected.

It should be noted that in contrast with prior art systems in which ringing of the vertical deflection coil 44 is relied upon to effect flyback and in which very sharp high voltage spikes occur, the circuit which has been described utilizes for flyback energy the area under an elongated pulse of substantially less voltage. Thus, the voltage necessary to initiate flyback may be kept to less than 50 volts, which is a level compatible with present monolithic integrated circuit techniques.

I claim:

1. A deflection control circuit for use in a television receiver having a cathode ray tube and at least one deflection coil operated during trace and flyback intervals for deflecting a beam in the cathode ray tube, the deflection control circuit including in combination:

first and second direct current voltage supply terminals;

current supply means coupled between said first and second supply terminals and having an output terminal for connection to said deflection coil for supplying current to and removing current from said coil;

first normally closed switch means opened in response to a control pulse;

storage capacitance means having first and second end terminals;

second switch means;

means coupling said second switch means, the first end terminal of said storage capacitance means, the second end terminal of said storage capacitance means and said first switch means in series circuit in the order named between said first and second supply terminal to complete a charging path for said storage capacitance means;

third normally open switch means coupled between said first supply terminal and the second end terminal of said storage capacitance means; said third switch means being closed in response to a control pulse; and means for applying a control pulse to said first and third switch means during said flyback intervals to open said first switch means and to close said third switch means, thereby causing the charge stored on said storage capacitance means to be increased; and means coupling the first end terminal of said storage capacitance means with said output terminal.

2. The combination according to claim 1 wherein said second switch means comprises unidirectional conductive means coupled to conduct current in the forward direction therethrough between said first supply terminal and the first end terminal of said storage capacitance means with said first switch means closed to complete the charging path for said storage capacitance means.

3. The combination according to claim 2 wherein said current supply means is coupled to said first supply terminal through said unidirectional conductive means at a junction formed by connection of said unidirectional conductive means with the first end terminal of said storage capacitance means.

4. The combination according to claim 2 wherein said storage capacitance means is a storage capacitor and said first and third switch means include first and second transistor means, respectively, each having at least collector, base, and emitter electrodes, with the collector-emitter path of said first transistor means connected in series circuit between the second end terminal of said capacitor and said second supply terminal, and with the collector-emitter path of said second transistor means being connected between said first supply terminal and the second end terminal of said capacitor, said means for applying the control pulse to said first and third switch means applying said control pulse at least to the base of said first transistor means, rendering said first transistor means nonconductive.

5. The combination according to claim 4 wherein said first and second transistor means are of the same conductivity type and further including circuit means connecting the collector of said first transistor means with the base of said second transistor means, and second unidirectional conductive means coupling the second terminal of said capacitor with the collector of said first transistor means and the base of said second transistor means, said second unidirectional conductive means being forward conductive in a direction opposite to the forward direction of conductivity of the base-emitter junction of said second transistor means; and said control pulse applying means applying said control pulse only to the base of said first transistor means, rendering said first transistor means nonconductive and said second transistor means conductive.

6. The combination according to claim 5 wherein said first and second transistor means each comprise a Darlington amplifier having at least two stages.

7. The combination according to claim 6 wherein said first voltage supply terminal supplies a potential which is positive with respect to said second voltage supply terminal and wherein said first and second transistor means comprise first and second NPN transistors, respectively, with the collector of said second transistor being connected with said first voltage supply terminal, and the emitter thereof being connected with the second end terminal of said capacitor, the collector of said first transistor being connected with the base of said second transistor and through said second unidirectional conductive means to the second end terminal of said capacitor and the emitter of said first transistor being connected with said second voltage supply terminal.

8. The combination according to claim 6 wherein both of said unidirectional conducting means are diode means.

* * * * *